United States Patent [19]
Imai

[11] Patent Number: 5,591,026
[45] Date of Patent: Jan. 7, 1997

[54] BAKING OVEN HAVING A MINIMIZED ACCESS OPENING

[75] Inventor: Kazuhiro Imai, Gunma-ken, Japan

[73] Assignee: Imai Seisakusho Co., Ltd., Japan

[21] Appl. No.: 576,964

[22] Filed: Dec. 26, 1995

[30] Foreign Application Priority Data

Sep. 6, 1995 [JP] Japan .................................. 7-255617

[51] Int. Cl.$^6$ ........................................................ F27D 3/00
[52] U.S. Cl. .............................. 432/239; 432/242; 432/5; 432/156
[58] Field of Search ..................................... 432/239, 241, 432/242, 5, 6, 11, 156; 118/724; 414/153, 156, 172, 198; 99/473, 474, 476

[56] References Cited

U.S. PATENT DOCUMENTS 5,221,201  6/1993  Yamaga et al. ............................ 432/6

Primary Examiner—Henry A. Bennett
Assistant Examiner—Pamela A. O'Connor
Attorney, Agent, or Firm—Dickstein, Shapiro, Morin & Oshinsky LLP

[57] ABSTRACT

In a baking oven for baking a relatively planar work such as semiconductor substrates, LCD panels and integrated circuit boards, a laterally elongated slot is formed in a shutter door which is moveable in the vertical direction. The oven main body is internally provided with a rack having a plurality of shelves which are each associated with the slot of the shutter door in such a manner that the work supported by each of the shelves of the rack may be aligned with the slot of the shutter door by appropriately determining the vertical position of the shutter door. Thus, by minimizing the area of the access opening of the oven main body, not only the loss of energy is minimized but also undesirable fluctuations in the internal temperature of the oven main body is minimized.

4 Claims, 6 Drawing Sheets

BAKING OVEN HAVING A MINIMIZED ACCESS OPENING

TECHNICAL FIELD

The present invention relates to a baking oven suitable for baking planar electronic components, such as LCD panels, integrated circuit boards, and semiconductor substrates.

BACKGROUND OF THE INVENTION

A conventional industrial baking oven is typically provided with a double door on the front end thereof so that the entire part of the interior of the oven may be made accessible by opening this door, and works such as LCD panels, integrated circuit boards, and semiconductor substrates may be charged into and discharged from the oven through this door. However, every time the door is opened, a substantial drop occurs in the temperature of the interior of the oven, and it means a substantial loss of energy. Furthermore, such changes in the temperature could adversely affect the baking process.

BRIEF SUMMARY OF THE INVENTION

In view of such problems of the prior art, a primary object of the present invention is to provide a baking oven which would not involve any substantial loss of energy when charging or discharging works into and out of the oven.

A second object of the present invention is to provide a baking oven which can maintain the temperature of the interior of the oven at a relatively fixed level.

A third object of the present invention is to provide a baking oven which is suitable for baking a large number of works in a highly efficient manner, and can thereby provide a high throughput.

A fourth object of the present invention is to provide a baking oven which is suitable for baking a large number of works in a highly efficient manner with minimum consumption of energy.

According to the present invention, such objects can be accomplished by providing a baking oven for baking a relatively planar work, comprising: a base frame defining an upper surface; an oven main body supported on the upper surface of the base frame, and having an open front end for allowing access into the oven main body; a shutter door closing the open front end of the oven main body, and disposed on the oven main body so as to be moveable vertically along the front end of the oven main body, a horizontal slot dimensioned for passing each work therethrough being defined in the shutter door; a rack placed inside the oven main body, and provided with a plurality of shelves each of which aligns with the slot when the shutter door is placed at a corresponding vertical position; actuating means for vertically moving the shutter door; and feed/removal means for feeding a work into each of the shelves through the slot, and removing a work from each of the shelves through the slot.

Thus, the area of the access opening of the oven main body is minimized so that the loss of energy is minimized. Also, because undesirable fluctuations in the internal temperature of the oven main body is also minimized, favorable baking results can be achieved even when the works are continually charged and discharged into and out of the oven at all times.

According to a preferred embodiment of the present invention, the feed/removal means comprises a manipulating arm which is placed in front of the shutter door, an input table to supporting a new unprocessed work, and an output table for supporting a processed work. Typically, the manipulating arm comprises a base end supported on the base frame in a vertically moveable manner, and an intermediate articulation joint provided in an intermediate part of the manipulating arm, and the feed/removal means further comprises a manipulating hand which is pivotally attached to a free end of the manipulating arm. By such an arrangement, efficient handling of the works is possible in a highly simple and economical manner. In particular, by properly arranging the schedule of the works in the oven, it is possible to keep the oven filled with works substantially at all times, and thereby efficiently utilize the oven.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
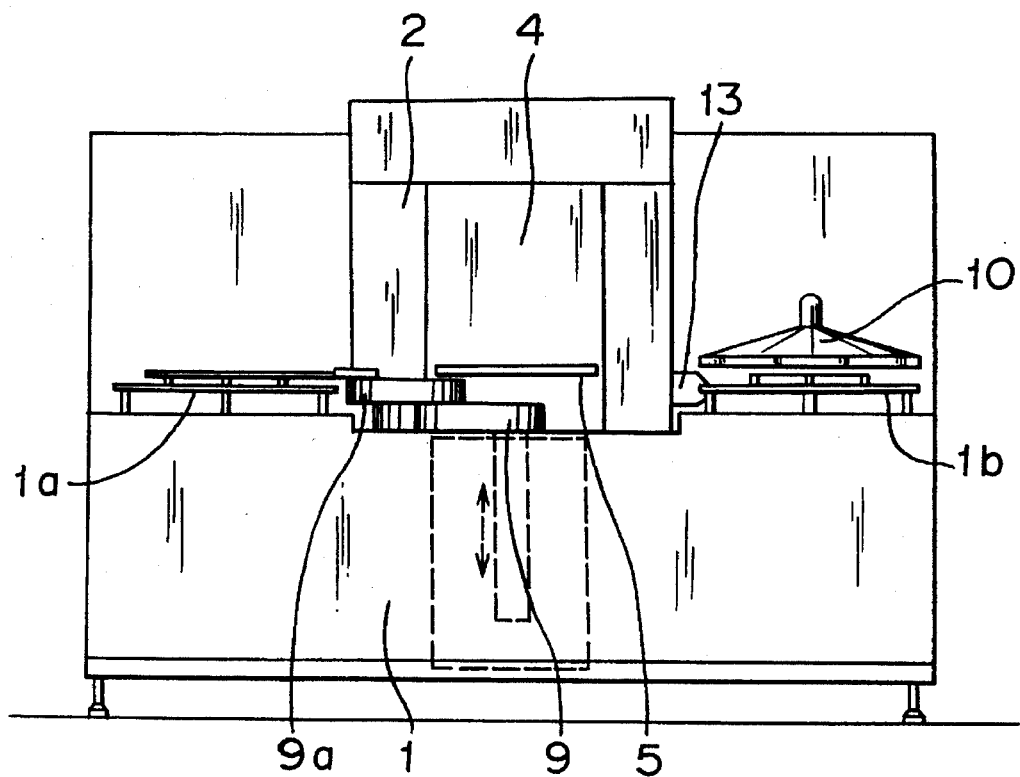
FIG. 1 is a front view of a preferred embodiment of the baking oven according to the present invention.

The baking oven illustrated in FIG. 1 comprises a base frame 1, and a oven main body 2 placed centrally on the upper surface of the base frame 1. The oven main body 2 has an access opening on the front end as described hereinafter, and is internally provided with a rack 3 having a large number of shelves for supporting the works charged from the access opening. Each shelf of the rack 3 comprises a pair of side flanges 3a for supporting the two side edges of each work (FIG. 6), and the side panels of the rack 3, to which the side flanges are attached, are provided with openings for allowing hot air to circulate freely inside the oven.

Figure 3:
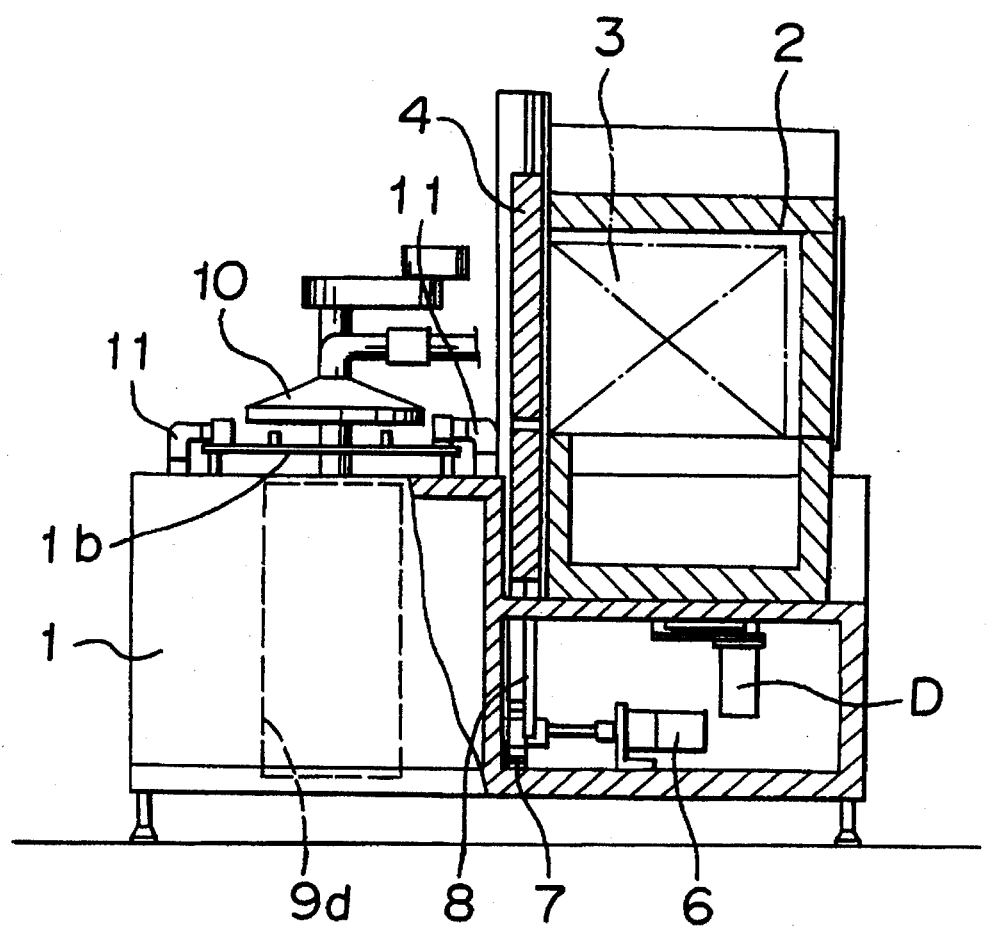
FIG. 3 is a partly broken away side view of the baking oven of FIG. 1.
Figure 6:
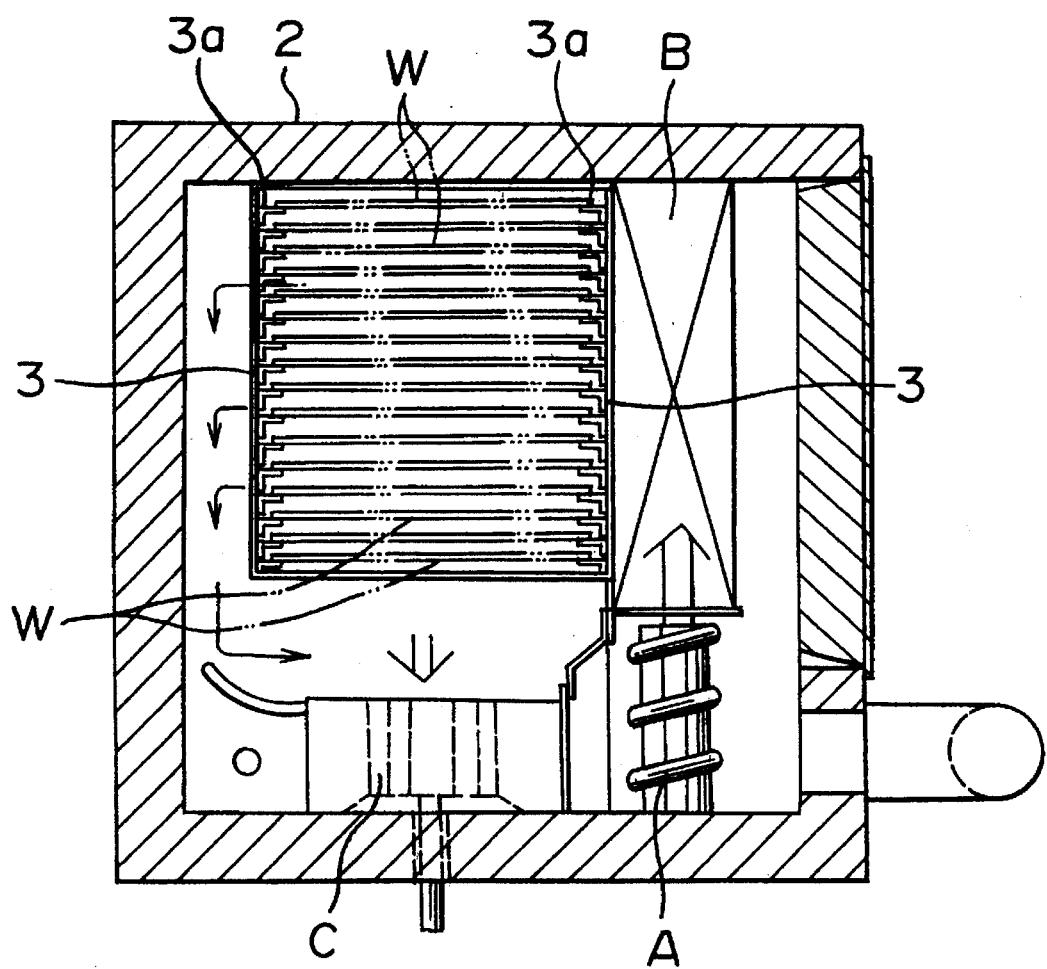
FIG. 6 is a sectional front view showing the interior of the oven.

As illustrated in FIG. 6, the oven main body 2 is internally provided with a sheathed heater A for producing heat, a HEPA filter B, and a sirocco fan C. The air heated by the sheathed heater A passes through the HEPA filter B, and impinges upon the works received in the rack 3. The hot air is then drawn into the sirocco fan C, and is circulated again along the above mentioned path. In FIG. 3, the letter D denotes a drive motor for the sirocco fan C.

The front end of the oven main body 2 is closed by a shutter door 4 which is placed on the otherwise open front end of the oven main body 2 in a vertically moveable manner. The shutter door 4 is provided with a laterally elongated slit or a laterally elongated slot 5 which is dimensioned so as to allow passage of at least one work. The slot 5 is provided in a position of the shutter door 4 so as to coincide with the uppermost shelf of the rack 3 when the shutter door 4 is at its uppermost position, and with the lowermost shelf of the rack 3 when the shutter door 4 is at its lowermost position.

Figure 4:
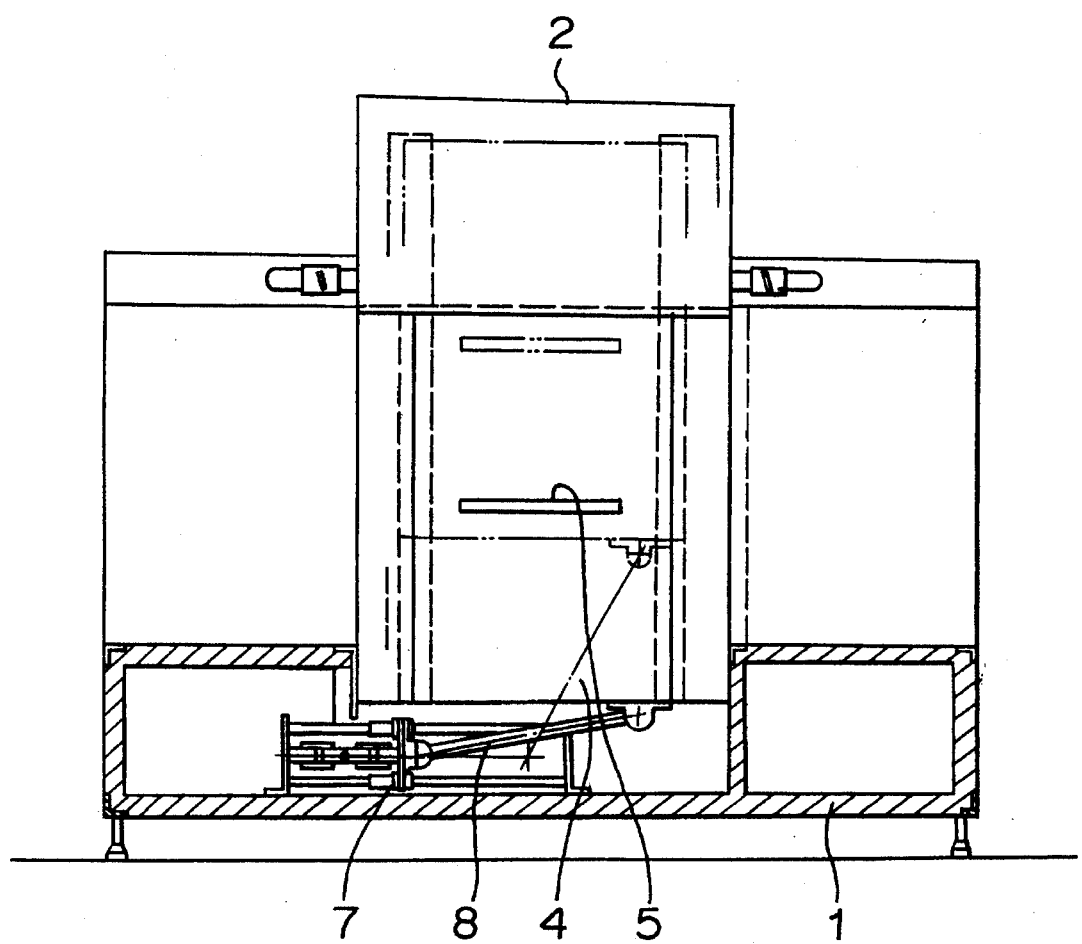
FIG. 4 is a partly broken away side view showing the shutter door of the baking oven of FIG. 1 in more detail.
Figure 5:
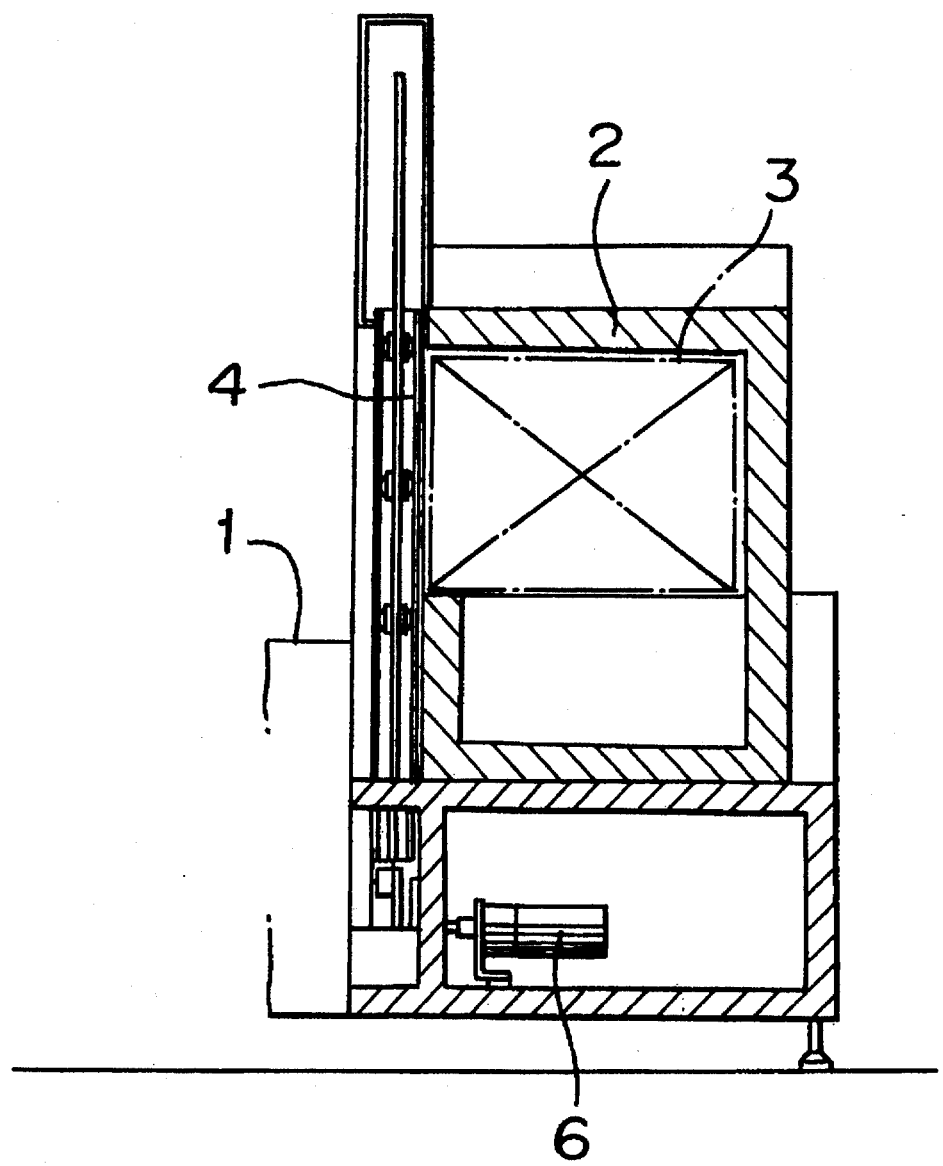
FIG. 5 is a sectional side view showing the shutter door.

The vertical movement of the shutter door 4 is effected by a mechanism which includes, as illustrated in FIGS. 3 and 4, an electric motor 6, a slider 7 adapted to move back and forth depending on the direction of rotation of the drive motor 6, a link rod 8 pivotally attached to the lower end of the shutter door 4 at its one end and to the slider 7 at its other end. The electric motor 6 is controlled in such a manner that the shutter door 4 may move vertically in a stepwise manner and the slot 5 may coincide with each one of the shelves of the rack 3 at each successive step.

Figure 2:
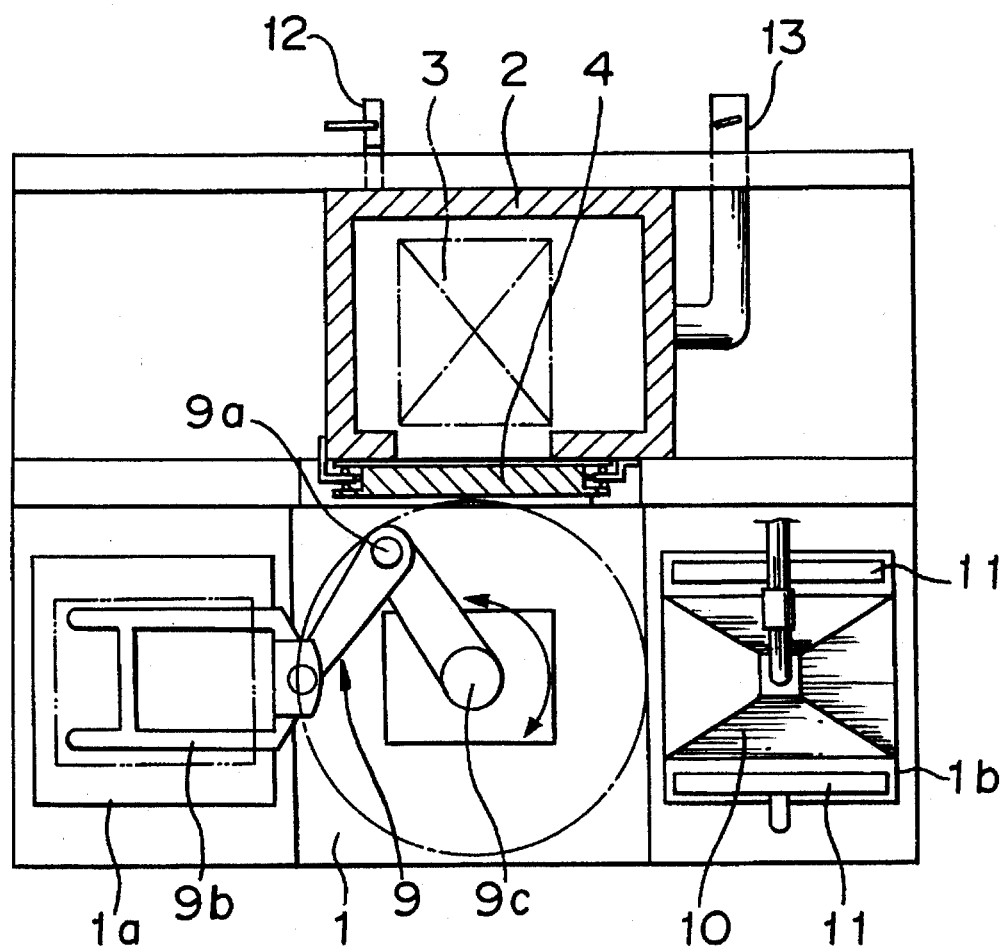
FIG. 2 is a partly broken away plan view of the baking oven of FIG. 1.

Referring to FIGS. 1 and 2, numerals 1a and 1b denote an input table and an output table, respectively, which are arranged on either side of the front end of the oven main body 2 in a symmetric fashion. These tables 1a and 1b are adapted to place a work thereon, and the input table 1a supports each work that is going to be processed while the output table 1b supports a work that has been processed. Numeral 9 denotes a feed/eject arm for picking up each work from the input table 1a, and placing it onto one of the shelves of the rack 3 provided inside the oven main body 2. This arm 9 is also used for picking up each processed work from the associated shelf of the rack 3 out of the slot 9 and placing the work on the output table 1b. This arm 9 may consist of a suitable conventional robot ann or the like.

More specifically, the arm 9 has a pivot articulation joint 9a in an intermediate point thereof, and a hand 9b is attached to the free end the arm via another pivot articulation joint so that the hand 9b can rotate around the base end 9c of the arm 9, and can also extend and retract radially away from and toward the base end 9c of the arm 9 as illustrated in FIG. 2. Additionally, the base end 9c of the arm 9 can be moved vertically by an actuating mechanism 9d incorporated in the base frame 1 so that the hand 9b can be aligned with the slot 5 at each vertical position thereof as the shutter door 4 moves vertically.

The output table 1b is covered from above by a hood 10 for blowing cooling air onto the processed work placed on the output table 1b. A pair of ducts 11 open out in front of and behind the output table 1b for drawing the air warmed by the processed work on the output table 1b so that the warmed air would not undesirably warm the work area. An intake duct 12 and an exhaust duct 13 each individually provided with a valve are communicated with the interior of the oven main body so that the temperature of the interior of the oven main body may be adjusted by suitably operating these valves.

Now the operation of this oven system is described in the following. Referring to FIG. 6, the air inside the oven is heated by conducting electric current through the sheathed heater A, and the heated aid is directed toward the rack via the HEPA filter by virtue of the sirocco fan C. The works W placed in the shelves of the rack are thus heated. The heated air circulates inside the oven as indicated by the arrows in FIG. 6.

The works are charged into the oven main body as described in the following. Initially, the shutter door 4 is placed at its lowermost position. As will be readily understood, it is also possible to start from the condition in which the shutter door 4 is at its uppermost position, but for the convenience of description, it is assumed that the shutter door 4 is initially at its lowermost position. The slot 5 of the shutter door 4 aligns with the lowermost shelf of the rack 3. Thus, the arm 9 is employed to scoop up the work placed on the input table 1a onto the upper surface of the hand 9b, and the thus picked up work is passed into the slot 5, and then onto the lowermost shelf of the rack 3.

Then, the shutter door 4 is lifted by a stroke corresponding to the distance between the first and second shelves of the rack 3, and the same action of the arm 9 is repeated so that the second work is picked up from the input table 1a and placed on the second lowest shelf of the rack 3. This procedure is repeated until the shutter door 4 is lifted to its uppermost position so as to align the slot 5 with the uppermost shelf of the rack 3, and to allow the work to be placed on the uppermost shell The vertical movement of the shutter door 4 is effected by advancing the slider 7 with the electric motor 6 so as to raise the connecting rod 8 having its free end pivotally attached to a lower end of the shutter door 4 as illustrated in FIGS. 3 and 4.

The removal of the works from the oven main body 2 can be accomplished by reversing the above described procedure. More specifically, upon completion of the charging of the works into the oven main body 2, the slot 5 of the shutter door 4 is at its uppermost position. It is possible to start the removal of the works in this condition, but it will cause an unevenness in the processing time of the works. It is therefore preferable to first lower the shutter door 4 down to its lowermost position, and then remove the works in the order they are charged. Each of the works is scooped up from the corresponding shelf of the rack 3 by using the hand 9b, and is placed on the output table 1b. The work is then cooled by air supplied from the cooling hood 10.

Thereafter, the shutter door 4 is lifted by the stroke corresponding to the distance between the two adjacent shelves of the rack 3, and the above described procedure is repeated. When the shutter door 4 is finally raised to its uppermost position, and the work in the uppermost shelf of the rack 3 is removed, the step of removing the works is completed.

According to the above described procedure, works of the next batch can be charged into the oven main body 2 only when the works of the current batch are completely removed from the oven main body 2. Therefore, a part of the interior of the oven main body 2 is kept vacant for a substantial period of time. Based on this recognition, more efficient utilization of the oven is possible by charging a new work into each shelf of the rack 3 as soon as the work in the corresponding shelf is removed. Thereby, all the shelves of the rack will be fully occupied substantially at all times, and the maximum utilization of the oven is made possible.

New works are supplied from an outer source onto the input table 1a by suitable conveying means which is not shown in the drawings, and processed works are likewise removed from the output table by suitable conveying means which is also not shown in the drawings.

Thus, according to the present invention, the access opening for the oven main body is minimized, and the loss of energy at the time of charging and removing works into and out of the oven main body is accordingly minimized. Also, changes in the inner temperature of the oven main body are likewise minimized, and satisfactory baking results can be achieved even when works are charged into and removed out of the oven main body continually. By activating the shutter door and the associated arm for charging and removing works in an appropriate manner, it is possible to keep the interior of the oven fully occupied by works at all times, and the oven can be utilized in a highly efficient manner.

Although the present invention has been described in terms of preferred embodiments thereof, it is obvious to a person skilled in the art that various alterations and modifications are possible without departing from the scope of the present invention which is set forth in the appended claims.

What we claim is:

1. A baking oven for baking a relatively planar work, comprising:

a base frame defining an upper surface;

an oven main body supported on said upper surface of said base frame, and having an open front end for allowing access into said oven main body;

a shutter door closing said open front end of said oven main body, and disposed on said oven main body so as to be moveable vertically along said front end of said oven main body, a horizontal slot dimensioned for passing a said work therethrough being defined in said shutter door;

actuating means for vertically moving said shutter door;

a rack placed inside said oven main body, and provided with a plurality of shelves each of which aligns with said slot when said shutter door is placed at a corresponding vertical position; and feed/removal means for feeding a said work into each of said shelves through said slot, and removing a said work from each of said shelves through said slot.

2. A baking oven according to claim 1, wherein said feed/removal means comprises a manipulating arm which is placed in front of said shutter door, an input table to supporting a new unprocessed work, and an output table for supporting a processed work.

3. A baking oven according to claim 2, wherein said manipulating arm comprises a base end supported on said base frame in a vertically moveable manner, and an intermediate articulation joint provided in an intermediate part of said manipulating arm, and said feed/removal means further comprises a manipulating hand which is pivotally attached to a free end of said manipulating arm.

4. A baking oven according to claim 2, further comprising air cooling means placed in association with said output table for cooling a said processed work placed on said output table.

* * * * *